US008723399B2

(12) United States Patent
Sammoura et al.

(10) Patent No.: US 8,723,399 B2
(45) Date of Patent: May 13, 2014

(54) TUNABLE ULTRASOUND TRANSDUCERS

(75) Inventors: Firas Sammoura, Melrose, MA (US); Sang-Gook Kim, Wayland, MA (US)

(73) Assignees: Massachusetts Institute of Technology, Cambridge, MA (US); Masdar Institute of Science and Technology, Abu Dhabi (AE)

(*) Notice: Subject to any disclaimer, the term of this patent is extended or adjusted under 35 U.S.C. 154(b) by 236 days.

(21) Appl. No.: 13/337,499

(22) Filed: Dec. 27, 2011

(65) Prior Publication Data
US 2013/0162102 A1 Jun. 27, 2013

(51) Int. Cl.
*H01L 41/08* (2006.01)
(52) U.S. Cl.
USPC .......................................... 310/320; 310/322
(58) Field of Classification Search
USPC ................................. 310/320–322
See application file for complete search history.

(56) References Cited

U.S. PATENT DOCUMENTS

| 4,063,049 A | 12/1977 | Pipitone et al. |
| 5,166,907 A | 11/1992 | Newnham |
| 6,445,109 B2 | 9/2002 | Percin et al. |
| 8,536,763 B2* | 9/2013 | Nakamura et al. ............ 310/324 |
| 2005/0162040 A1* | 7/2005 | Robert ........................ 310/322 |

OTHER PUBLICATIONS

Wang, Chao et al., "A Micromachined Piezoelectric Ultrasonic Transducer Operating in d33 Mode Using Square Interdigital Electrodes", IEEE Sensors Journal vol. 7 No. 7 Jul. 2007 Jul. 2007, 967-976.
Ergun, Arif S. et al., "Capacitive Micromachined Ultrasonic Transducers: Theory and Technology", Journal of Aerospace Engineering ASCE / Apr. 2003 Apr. 2003, 76-84.
Przybyla, Richard et al., "An Ultrasonic Rangefinder Based on an AlN Piezoelectric Micromachined Ultrasound Transducer", Berkeley Sensor and Actuator Center, University of California, Davis CA 2010, 1-5.
Yamashita, Kaoru et al., "Piezoelectric Tunable Resonant Microsensors for High Resolution and Ghost-Suppressive Ultrasonic Measurement", Proceedings of the Eurosensors XXIII conference Kyoto Institute of Technology 2009, 1-4.
Al-Ahmad, M et al., "Piezoelectric-based tunable microstrip shunt resonator", Microwave Conference, 2006. APMC 2006. Asia-Pacific Yokohama Dec. 15, 2006, 653-656.

* cited by examiner

*Primary Examiner* — Derek Rosenau
(74) *Attorney, Agent, or Firm* — Strategic Patents, P.C.

(57) ABSTRACT

A variety of micromachined structures are disclosed for use in DC-tunable ultrasound transducers.

21 Claims, 5 Drawing Sheets

TUNABLE ULTRASOUND TRANSDUCERS

BACKGROUND

Piezoelectric Micromachined Ultrasound Transducers (PMUTs) have emerged as a substitute to conventional ultrasonic sensors. A typical PMUT is a suspended membrane clamped at its edges and driven through piezoelectric effect by the application of an AC voltage. For instance, an air-coupled PMUT using Aluminum Nitride (AlN) as the active piezoelectric material is disclosed in Shelton, et al., "CMOS-Compatible AlN Piezoelectric Micromachined Ultrasonic Transducers," 2009 *IEEE International Ultrasonics Symposium* (IUS), pp. 402-405, Rome, Italy, Sep. 20-23, 2009, incorporated by reference herein in its entirety. Other PMUTs have been demonstrated using, e.g., Lead Zirconate Titanate (PZT), which appears particularly promising in its Perovskite-phase due to a high degree of piezoelectric and ferroelectric coupling.

Thus, while a useful transducer may be micro-machined from Perovskite-phase PZT or other suitable material, many ultrasound applications require a range of operating frequencies that cannot be optimally addressed by a single transducer. For example, medical imaging may require frequencies ranging from 1-18 MHz (e.g., 1-6 MHz for deep structures and 7-18 MHz for superficial structures).

There remains a need for tunable PMUTs to address applications that have multiple operating frequencies or ranges of operating frequencies.

SUMMARY

A variety of micromachined structures are disclosed for use in DC-tunable ultrasound transducers.

DRAWINGS

The invention may be more fully understood with reference to the accompanying drawings wherein.

DETAILED DESCRIPTION

A variety of techniques are disclosed herein for constructing a Piezoelectric Micromachined Ultrasonic Transducer that can be tuned with an applied current (or voltage). It will be appreciated that the following embodiments are provided by way of example only, and that numerous variations and modifications are possible. For example, the transducer may use capacitive transducers, or a wide variety of piezoelectric materials. All such variations that would be apparent to one of ordinary skill in the art are intended to fall within the scope of this disclosure. It will also be appreciated that the following drawings are not necessarily to scale, with emphasis being instead on the distinguishing features of the tunable transducers disclosed herein. Suitable dimensions for corresponding micromachined structures, and techniques for achieving same, may be readily ascertained by one of ordinary skill in the art.

Figure 1:
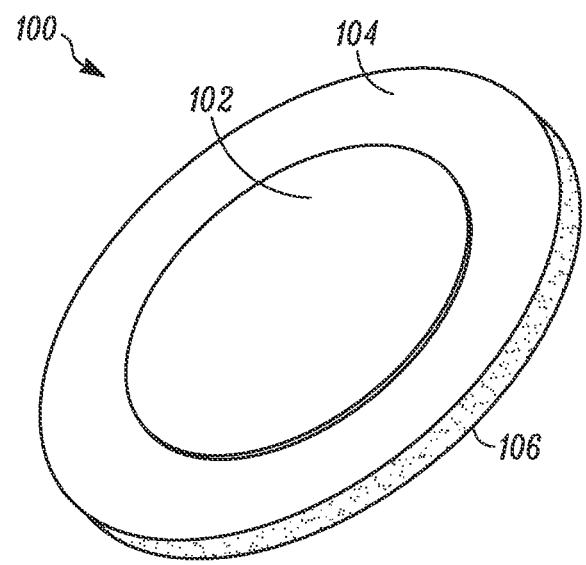
FIG. 1 is a perspective drawing of an ultrasonic transducer.

FIG. 1 is a perspective drawing of an ultrasonic transducer. In general, a Piezoelectric Micromachined Ultrasonic Transducer includes a cavity (not shown) covered by a flexible piezoelectric membrane such as the transducer 100 that deforms mechanically in response to an applied voltage or current. A typical transducer 100 may be disk-shaped with an outside diameter of about 100 μm, although it will be understood that a wide variety of shapes and sizes may also or instead be employed according to the intended use and/or frequency of operation. For example, in medical ultrasound imaging, sizes from about 50 μm to about 250 μm may be used for operating frequencies from about 1 MHz to about 18 MHz. In general, the transducer 100 may include an electrode 102, a piezoelectric material 104, and a substrate 106.

The electrode 102 may be formed of copper, aluminum, or any other suitably conductive material for coupling the transducer 100 to a current or voltage supply.

The piezoelectric material 104 may be any material demonstrating sufficient piezoelectric response to serve in the ultrasound applications contemplated herein. In one aspect, the piezoelectric material 104 may include Lead Zirconate Titanate (PZT) in Perovskite-phase. Other piezoelectric materials suitable for micromachining include, e.g., other compositions of Lead Zirconate Titanate (in moncrystaline or polycrystaline forms), Aluminum Nitride, a piezoelectric ceramic bulk material, and so forth. More generally, any material or combination of materials having suitable piezoelectric response and amenable to micromachining or other incorporation into micro-electrical mechanical systems may be used as the piezoelectric material 104.

The substrate 106 may for example, be silicon in a bulk Silicon on Insulator wafer, or any other material suitable as a substrate for fabrication of micromachined components.

The transducer 100 may be fabricated using any of a variety of micromachining techniques including without limitation deposition, patterning, etching, silk screening, and so forth. The variety of micromachining techniques for fabricating structures of silicon, polymers, metals, and ceramics are well known in the art, and may variously be employed according to the shape, dimensions, and material (or combination of materials) used in a particular transducer 100.

A variety of tunable structures for use with the transducer 100 are now described in greater detail.

Figure 2:
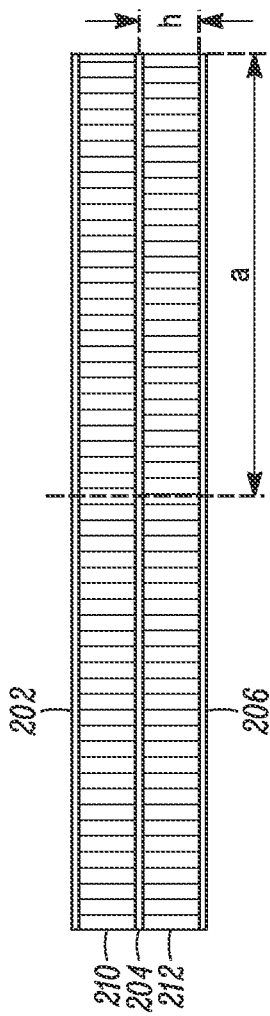
FIG. 2 is cross-section of a tunable Piezoelectric Micromachined Ultrasonic Transducer (PMUT) formed of a piezoelectric bimorph.

FIG. 2 is cross-section of a tunable Piezoelectric Micromachined Ultrasonic Transducer (PMUT) device formed of a piezoelectric bimorph. In general, the transducer 200, which may be a disk as illustrated above, or any other suitable two-dimensional shape, includes a first conductor 202, a second conductor 204, and a third conductor 206, which collectively surround a first piezoelectric material 210 and a second piezoelectric material 212 as generally depicted in FIG. 2.

Figure 3:
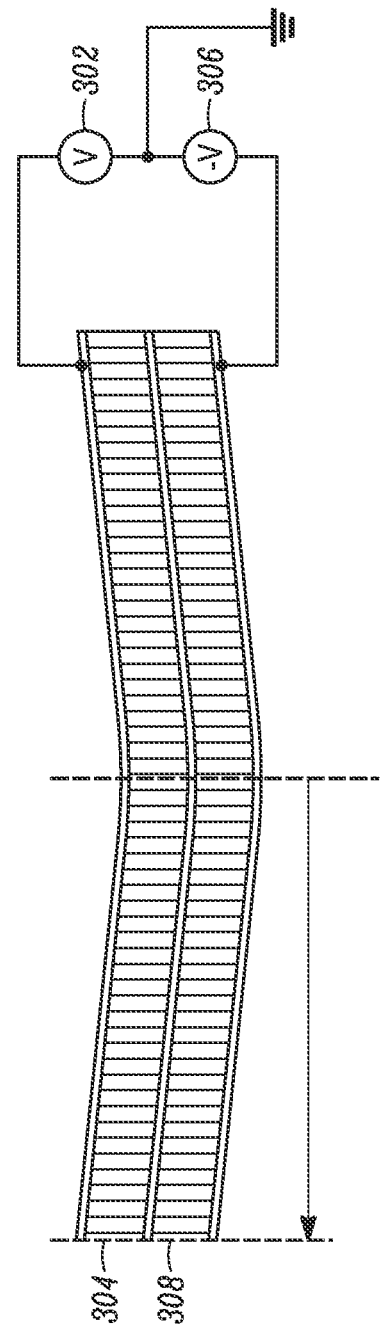
FIG. 3 is a cross-section of a piezoelectric bimorph with an applied bias voltage.

FIG. 3 is a cross-section of a piezoelectric bimorph with an applied bias voltage. By applying a positive voltage 302 to a first piezoelectric material 304, and a negative voltage 306 to a second piezoelectric material 308, the piezoelectric materials 304, 308 can be induced to bend as generally illustrated through piezoelectric response. More generally, where these layers are driven with opposing polarity at ultrasonic frequencies such that one expands while the other contracts, bending can be induced in the entire structure to produce ultrasonic output. Where the layers are driven together, the entire structure can be expanded in-plane. The resulting change in radial dimensions (labeled "a" in FIG. 2) causes the transducer 300 to expand or contract within a supporting structure, thus tensioning the transducer 300 and increasing the resonant frequency of operation or decreasing tension to reduce the resonant frequency. Stated differently, the presence of a DC bias across the conductors of a piezoelectric bimorph can induce a continuous physical deformation that alters the resonant frequency.

It will be noted that, while some of the following embodiments employ discrete transducers, support structures, and tensioning structures, some of the materials in these structures may usefully serve functional roles in two or more of the structures. For example, the piezoelectric bimorph described above combines several of these functions so that the tensioning feature used to vary resonant frequency is obtained from the same structure that provides ultrasonic transduction. Thus it will be appreciated that various functions of transducing, tensioning, and support may in various embodiments be performed by the same structure, by different structures, or by some combination of these, all without departing from the scope of the invention. Similarly, the bimorph embodiment above may be described as a transducer coupled to a tunable structure, or alternatively as a transducer integrated into a tunable structure, or alternatively as a transducer and a tunable structure that collectively form two layers of a piezoelectric bimorph, all without departing from the intended meaning of these terms as used herein.

Figure 4:
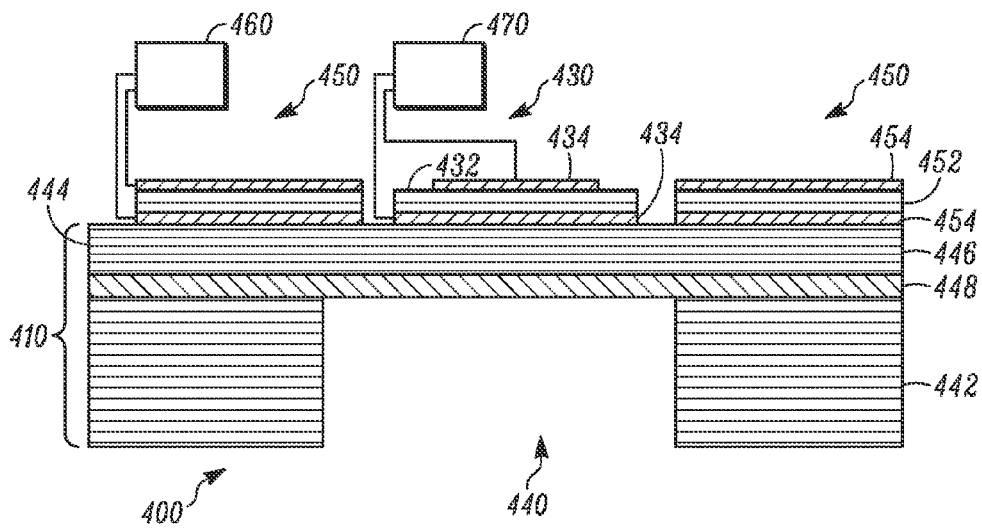
FIG. 4 is a cross-section of a tunable PMUT structure with a surrounding tensioning structure.

FIG. 4 is a cross-section of a tunable PMUT device with a surrounding tensioning structure. In general, the device 400 may include a support structure 410, a transducer 430, and a tensioning ring 450. The support structure 410 may support the transducer 430 over a cavity 440, while the tensioning ring 450 can be actuated by piezoelectric effect to create tension within the support structure 410 in the plane where the transducer 430 is supported, thus altering the resonant frequency thereof. The device 400 may be a d31-mode piezoelectric transducer. There are two piezoelectric modes—d31 and d33—that are commonly used in piezoelectric transducers. These modes are distinguished from one another by whether the electrical field direction is perpendicular to the input strain direction (d31) or parallel to it (d33).

The support structure 410 may be any suitable structure for suspending the transducer 430 about the cavity 440 or other chamber for resonant operation. The support structure 410 may, for example, include one or more handles 442 or similar structures of silicon or the like that support a substrate 444 for the transducer 430. The substrate 444 may include a number of layers such as a device layer 446 formed of a bulk Silicon on Insulator wafer or other suitable material, along with an oxide 448 or other etch stop or the like used to isolate fabrication of the support structure 410 and other components during micromachining. In general, the support structure 410 suspends the micromachined transducer 430 and/or the tensioning ring 450 (or other tunable structure, further embodiments of which are discussed below) at one or more edges.

The transducer 430 may be any of the transducers described above, or more generally any suitable micromachinable ultrasonic transducer structure. In one aspect, the transducer 430 may include a piezoelectric material 432, such as any of the piezoelectric materials described above, between two conductors 434, such as any of the conductors described above. The conductors 434 generally provide electrical contact to the piezoelectric material in order to either apply voltage for ultrasonic output from the transducer 430, or in order to sense voltage for ultrasonic input from the transducer 430. The conductors 434 may be patterned onto the piezoelectric material 432 in any manner consistent with this operation.

The tensioning ring 450 may be coupled to the substrate 444 of the support structure 410 and wholly or partially surround the transducer 430. The tensioning ring 450 may include a second piezoelectric material 452 (which may be of the same type or a different type than the piezoelectric material 432) between two conductors 454, which may be patterned on to a top and bottom of the second piezoelectric material 452 in any manner consistent with an application of direct current or voltage to the second piezoelectric material 452. The tensioning ring 450 may be tensioned by an application of direct current, which expands or contracts the piezoelectric material 452 (e.g., outward to the left and right from the transducer 430), thus creating tension in a plane of the substrate 444 of the support structure 410 and changing the resonant frequency of operation of the transducer 430 that is suspended thereon.

Thus, the tensioning ring 450 and the substrate 444 may form a tunable structure that, together with the transducer 430, further form a resonator having a resonant frequency that is controllable by applying a direct current. In general, the piezoelectric material 452 of the tensioning ring changes shape according to an applied direct current, and is responsive to changes in the applied direct current to vary a resonant frequency of the overall structure.

It will be appreciated that direct current here refers generally to any bias voltage or direct current that remains relatively stable over a time during which the resonant frequency is desired to be maintained. It will also be appreciated that the term resonator, as used herein, is not intended to imply any particular quantitative or qualitative degree of resonance, except to the degree necessary to characterize a resonant frequency for operation of the structure 400.

A direct current source 460 may be coupled to the second piezoelectrical material 452 through the two conductors 454 of the tensioning ring 450 in order to control tuning of the device 400. Additionally, an alternating current source 470 may be coupled to the first piezoelectric material 432 through the two conductors 434 of the transducer 430 in order to create ultrasonic output from the transducer 430. The transducer 430 may also or instead be coupled to signal detection circuitry in order to measure ultrasonic signals through the transducer 430. For applications such as medical imaging, the transducer 430 may usefully be operated at range from about 1 MHz to about 18 MHz, and the tensioning ring 450 may usefully provide tuned resonance anywhere over this range. In certain embodiments where tuning structures provide a more limited range of tuned resonance, a number of such tunable structures may nonetheless be used over adjacent or overlapping ranges in order to effectively reduce the number of transducers 430 required or desired to cover a range of measurements.

Figure 5:
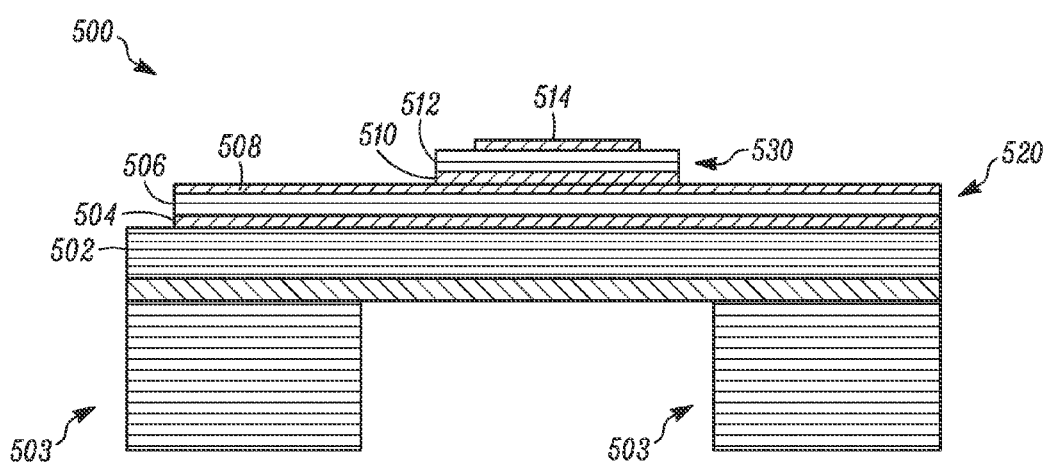
FIG. 5 is a cross-section of a tunable PMUT structure with a planar tensioning structure.

FIG. 5 is a cross-section of a tunable PMUT device with a planar tensioning structure. The device 500 may be a d31-mode PMUT with a support structure largely as described above. The device 500 may include a substrate 502 such as any of the substrates described above, a tunable structure 520, and a transducer 530.

The substrate 502 may be formed of silicon or any other suitable substrate material, and may provide a top surface of a support structure 503 that suspends the tunable structure 520 and the transducer 530 above a cavity for use as an ultrasonic transducer or the like. The support structure 503 may be formed as a continuous perimeter or ring about the tunable structure 520, or as two or more discrete posts, standoffs, or other structures that securely support the tunable structure 520 at a number of specific locations or regions around the cavity.

The tunable structure 520 may include a first conducting layer 504, a first piezoelectric material 506, and a second conducting layer 508. The first piezoelectric material 506 and the conducting layers 504, 508 may in general be any of the materials described above. The first piezoelectric material 506 may form a planar surface coupled to the substrate 502 on a first side (the bottom side, in FIG. 5) and coupled to the transducer 530 on a second side (the top side, in FIG. 5). It will be appreciated that this coupling is mechanical in nature, and may include coupling through any number of electrical surfaces (such as the conducting layers 504, 508), insulating layers, vestigial micromachining processing layers, and so forth. In general, a field may be applied to the first piezoelectric material 506 of the tunable structure 520 through the conducting layers 504, 508 in order to induce an expansion or contraction of the tunable structure 520. Because this tunable structure 520 is rigidly secured at its perimeter by the support structure 503 and/or substrate 502, this expansion or contraction creates tension within the tunable structure 520 to increase the resonant frequency of a resonator formed by the tunable structure 520 and the transducer 530. As noted above, the reference to a resonator here is not intended to refer to specific elements of the device 500 or any particular qualitative or quantitative resonant properties, but rather to any generalized collection of the various components for which a resonant frequency can be adjusted through an application of direct current to the tunable structure 520.

The support structure 503 may generally be coupled to a perimeter of the tunable structure 520 on a surface opposing the piezoelectric material of the tunable structure 520 (e.g., through the substrate 502 and any other intervening layers). In this configuration, the first piezoelectric material 506 of the tunable structure 520 may overlap the support structure 503 on its ends in order to secure or clamp the ends of the tunable structure 520 in a manner that permits tensioning of the tunable structure 520 against the support structure 503 by expansion or contraction of the first piezoelectric material 506. As discussed above, the support structure 503 may be coupled to a perimeter of the tunable structure 520 so as to permit ultrasonic movement of the transducer 530 on the tunable structure 520 relative to the support structure 503.

The transducer 530 may be an ultrasonic transducer as generally described above, and may include a third conducting layer 510, a second piezoelectric material 512 and a fourth conducting layer 514. The second piezoelectric material 512 and the conducting layers 510, 514 may in general be any of the materials described above. The conducting layers 510, 512 may be used to apply a field to or detect a field from the second piezoelectric material 412 for ultrasonic transduction as generally contemplated herein. In one aspect, the third conducting layer 510, which forms a bottom electrical contact for the transducer 530, may be electrically coupled to or formed of the same material as the second conducting layer 508, which forms a top electrical contact for the tunable structure 520. In another aspect, an insulating layer may be placed between these conductors in order to electrically isolate operation of the transducer 530 and the tunable structure 520.

Figure 6:
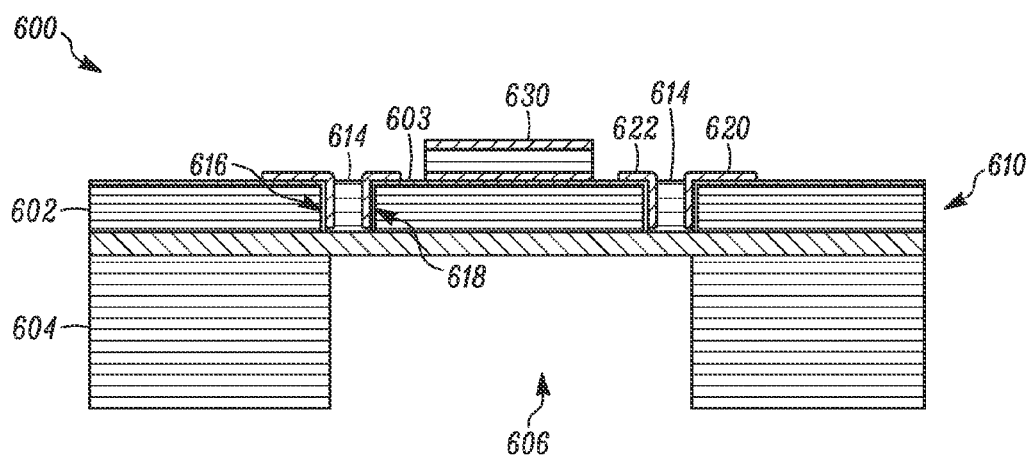
FIG. 6 is a cross-section of a tunable PMUT structure with a tensioning ring.

FIG. 6 is a cross-section of a tunable PMUT device with a tensioning ring or gap. The device 600 may be a d33-mode PMUT with a tunable structure 610 embedded within a substrate for a transducer 630. In general, the transducer 630 may be any of the transducers described above.

The tunable structure 610 may include a first substrate 602, which may be formed of silicon, and have an outside perimeter 612 coupled to a support structure 604 about a cavity 606, and a second substrate 603 that supports the transducer 630. In general, a piezoelectric material 614 of the tunable structure 610 may form an annular ring between an insider perimeter 616 of the first substrate 602 and an outside perimeter 618 of a second substrate 603 for the transducer 630. It will be noted that the first substrate 602 and the second substrate 603 may be formed as a single substrate from a single silicon layer during fabrication, with the annular ring formed for the piezoelectric material 612 in a subsequent processing step. It will also be noted that while the term 'annular ring' is used to describe a material filling a void between the substrates 602, 603, this term is used in a general sense and is not intended to suggest a specific mathematical or geometric shape for the piezoelectric material 614, except that the material fills (wholly or partially) a space between the substrates and surrounds (wholly or partially) the second substrate 603 that supports the transducer 630.

The tunable structure 610 may also include a first electrical contact 620 disposed on the inside perimeter 616 of the first substrate 602, and a second electrical contact 622 disposed on the outside perimeter 618 of the second substrate 603. The first electrical contact 620 and the second electrical contact 622 may be electrically coupled to the piezoelectric material 614 for an application of direct current thereto. By applying a direct current or voltage across these electrical contacts 620, 622, the piezoelectric material 614 may be induced to expand or contract, thereby tensioning the tunable structure 610 that supports the transducer 630 and changing the resonant frequency of a resonator formed by the tunable structure 610 and the transducer 630.

Figure 7:
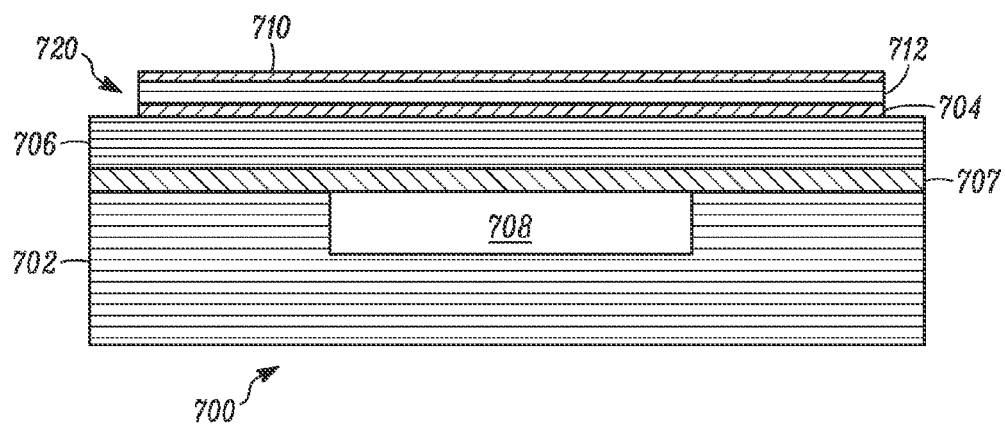
FIG. 7 is a cross-section of a tunable Capacitive Micromachined Ultrasonic Transducer.

FIG. 7 is a cross-section of a tunable Capacitive Micromachined Ultrasonic Transducer device. The device 700 may be a frequency-tunable Capacitive Micromachined Ultrasonic Transducer ("CMUT") using a d31-mode piezoelectric. In general, the device 700 may include a handle layer 702 that insulates a silicon substrate (typically a heavily doped silicon layer, not shown) or the like from an electrode 704 supported on a membrane 706, all of which surrounds a cavity 708 permitting movement of the electrode 704 in response to a capacitive coupling of the electrode 704 to the silicon substrate. The fabrication and use of CMUT's is generally well known in the art, and further details are not repeated here, except to the extent that they relate to resonant tuning of the device 700.

In order to change a resonant frequency of the device 700, a tuning structure 720 may be formed of the electrode 704, a second electrode 710, and a piezoelectric material 712. In general, the piezoelectric material 712 may be tensioned over the membrane 706 (and any other layers 707) using the techniques described above to create in-plane stress in the tuning structure 720 in order to increase or decrease a resonant frequency of the resonator formed about the cavity 708. It will be appreciated that the electrode 704 may be a single electrode that is used for the CMUT and the tensioning structure 720, or separate electrodes (separated by an insulating layer or the like) may be provided in order to electrically isolate operation of the CMUT and the tensioning structure 720.

Figure 8:
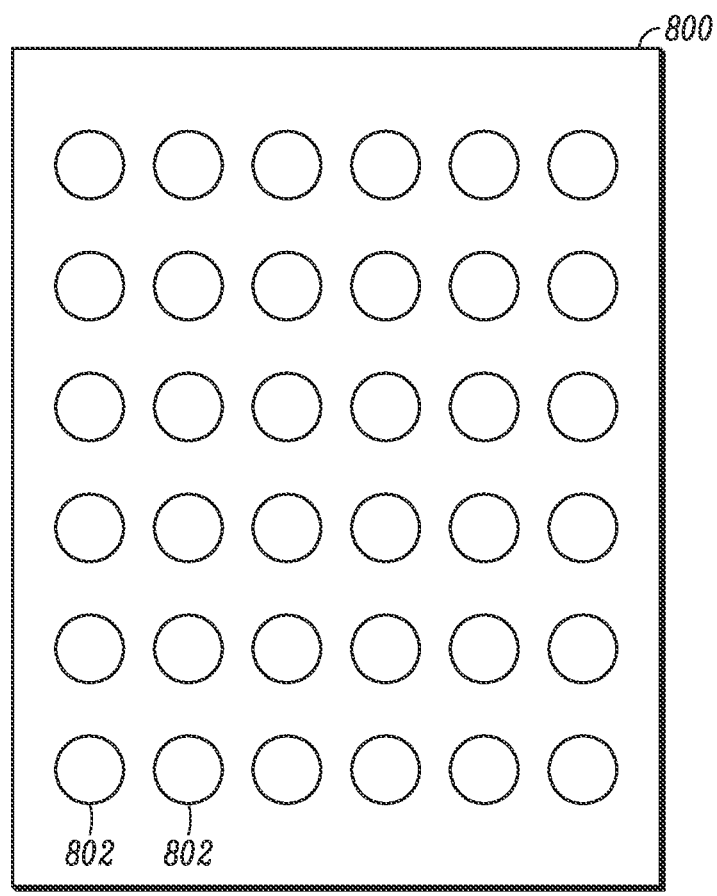
FIG. 8 is an array of tunable ultrasound transducers.

FIG. 8 shows an array of tunable ultrasound transducers. The array 800 may include a plurality of transducers 802 arranged on any suitable substrate, each coupled to a support structure such as any of the support structures described above and each including a tunable structure that permits a resonant frequency to vary according to an applied direct current. The transducers 802 may be independently driven or commonly driven or some combination of these according to an intended use of the array. Similarly, the resonant frequency of each transducer 802 may have an independently controllable resonant frequency, or two or more of the transducers 802 may have a commonly controllable resonant frequency, or some combination of these. Different groups of the transducers 802 may have different ranges of tuning for the resonant frequency and may be shaped, sized, and structured accordingly. In addition, the array 800 may include one or more transducers that have a fixed resonant frequency. Thus, a variety of arrays of ultrasonic transducers may be usefully fabricated, either in a single micromachining process or in a number of different micromachining processes to provide an array of tunable ultrasonic transducers for a wide range of potential applications.

It will be appreciated that the methods and systems described above are set forth by way of example and not of limitation. Numerous variations, additions, omissions, and other modifications will be apparent to one of ordinary skill in the art. While particular embodiments of the present invention have been shown and described, it will be apparent to those skilled in the art that various changes and modifications in form and details may be made therein without departing from the spirit and scope of the invention as defined by the following claims. The claims that follow are intended to include all such variations and modifications that might fall within their scope, and should be interpreted in the broadest sense allowable by law.

What is claimed is:

1. A micromachined device comprising:
an ultrasonic transducer;
a tunable structure coupled to the ultrasonic transducer, the ultrasonic transducer and the tunable structure forming a resonator having a resonant frequency; and
a piezoelectric material within the tunable structure that changes shape according to an applied direct current, wherein the piezoelectric material is responsive to a change in the applied direct current to vary the resonant frequency of the resonator, and wherein the piezoelectric material forms an annular ring between an inside perimeter of a first substrate for the tunable structure and an outside perimeter of a second substrate for the ultrasonic transducer.

2. The device of claim 1 wherein the annular ring creates a tension about the ultrasonic transducer, wherein both the annular ring and the ultrasonic transducer are coupled to a surface of a substrate of the tunable structure.

3. The device of claim 2 wherein the substrate is formed of silicon.

4. The device of claim 1 wherein the piezoelectric material forms a planar surface coupled to the first substrate on a first side and coupled to the second substrate on a second side.

5. The device of claim 4 further comprising a support structure coupled to a perimeter of the tunable structure on a surface opposing the piezoelectric material, wherein the piezoelectric material overlaps the support structure.

6. The device of claim 5 wherein the substrate is formed of silicon.

7. The device of claim 1 wherein the first substrate and the second substrate are formed of a single layer of silicon.

8. The device of claim 7 further comprising a first electrical contact on the inside perimeter of the first substrate and a second electrical contact on the outside perimeter of the second substrate, the first electrical contact and the second electrical contact electrically coupled to the piezoelectric material for an application of direct current thereto.

9. The device of claim 1 wherein the ultrasonic transducer includes a piezoelectric micromachined ultrasonic transducer.

10. The device of claim 1 wherein the ultrasonic transducer includes a capacitive micromachined ultrasonic transducer.

11. A micromachined device comprising:
an ultrasonic transducer comprising a first piezoelectric material;
a tunable structure coupled to the ultrasonic transducer, the ultrasonic transducer and the tunable structure forming a resonator having a resonant frequency; and
a second piezoelectric material within the tunable structure that changes shape according to an applied direct current, the second piezoelectric material responsive to a change in the applied direct current to vary the resonant frequency of the resonator, wherein the ultrasonic transducer and the tunable structure form two layers of a piezoelectric bimorph.

12. The device of claim 1 further comprising a support structure coupled to a perimeter of the tunable structure so as to permit ultrasonic movement of ultrasonic transducer on the tunable structure relative to the support structure.

13. The device of claim 1 further comprising a direct current source coupled to the piezoelectric material.

14. The device of claim 1 further comprising an alternating current source coupled to the ultrasonic transducer.

15. The device of claim 1 wherein the piezoelectric material includes a lead-zirconate-titanate (PZT).

16. The device of claim 15 wherein the PZT is a Perovskite-phase PZT.

17. The device of claim 1 wherein the piezoelectric material includes a piezoelectric ceramic bulk material.

18. The device of claim 1 wherein the resonant frequency is tunable over a range from 1-18 MHz.

19. The device of claim 11 further comprising an array of ultrasonic transducers, each coupled to a support structure having a resonant frequency that varies according to an applied direct current.

20. The device of claim 19 wherein each one of the array of ultrasonic transducers has an independently controllable resonant frequency.

21. The device of claim 11 further comprising a support structure that suspends the micromachined device at one or more edges.

* * * * *